US008813363B2

(12) United States Patent
Lee et al.

(10) Patent No.: US 8,813,363 B2
(45) Date of Patent: Aug. 26, 2014

(54) PIEZOELECTRIC INKJET PRINTHEAD AND METHOD OF MANUFACTURING THE SAME

(75) Inventors: Jae-chang Lee, Hwaseong-si (KR); Jae-woo Chung, Yongin-si (KR); Kyo-yool Lee, Yongin-si (KR); Chang-seung Lee, Yongin-si (KR); Sung-gyu Kang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 1117 days.

(21) Appl. No.: 12/722,843

(22) Filed: Mar. 12, 2010

(65) Prior Publication Data

US 2010/0167433 A1 Jul. 1, 2010

Related U.S. Application Data

(62) Division of application No. 11/468,954, filed on Aug. 31, 2006, now Pat. No. 7,695,118.

(30) Foreign Application Priority Data

Jan. 26, 2006 (KR) .......................... 10-2006-008239

(51) Int. Cl.

*B21D 53/76* (2006.01)
*B23P 17/00* (2006.01)
*H01L 41/22* (2013.01)
*H04R 17/00* (2006.01)
*H01L 41/00* (2013.01)

(52) U.S. Cl.

USPC .... 29/890.1; 29/25.35; 310/311; 310/316.01; 310/317

(58) Field of Classification Search

CPC .... B41J 2/14233; B41J 2/1629; B41J 2/1623; B41J 2/161; B41J 2/1628
USPC ............... 29/890.1, 25.35; 241/235; 310/311, 310/316.01, 317
See application file for complete search history.

(56) References Cited

U.S. PATENT DOCUMENTS 5,265,315 A * 11/1993 Hoisington et al. ......... 29/25.35
5,856,837 A * 1/1999 Kitahara et al. ................ 347/70

(Continued)

FOREIGN PATENT DOCUMENTS

EP 0 413 340 2/1991
JP 56-106869 8/1981

OTHER PUBLICATIONS

Korean Office Action issued Nov. 23, 2011 in KR Application No. 10-2006-0008239.

*Primary Examiner* — David Angwin
(74) *Attorney, Agent, or Firm* — Stanzione & Kim, LLP

(57) ABSTRACT

A method of manufacturing a piezoelectric inkjet printhead includes processing a lower silicon-on-insulator substrate having a sequentially stacked structure with a first silicon layer, an intervening oxide layer, and a second silicon layer, processing the lower silicon-on-insulator substrate by etching the second silicon layer to form a manifold, a plurality of pressure chambers arranged along at least one side of the manifold and connected with the manifold, and a plurality of dampers connected with the pressure chambers, and by etching the first silicon layer and the intervening oxide layer to form a plurality of vertical nozzles through the first silicon layer and the intervening oxide layer to corresponding ones of the plurality of dampers, stacking and bonding an upper substrate on the lower substrate, reducing the upper substrate to a predetermined thickness, and forming a piezoelectric actuator on the upper substrate.

22 Claims, 15 Drawing Sheets

(56) References Cited

U.S. PATENT DOCUMENTS

| | | | | |
|---|---|---|---|---|
| 6,398,348 | B1 * | 6/2002 | Haluzak et al. | 347/63 |
| 6,502,930 | B1 * | 1/2003 | Shimada et al. | 347/71 |
| 6,796,640 | B2 * | 9/2004 | Miyata | 347/71 |
| 6,905,202 | B2 * | 6/2005 | Shimamoto et al. | 347/94 |
| 7,135,121 | B2 * | 11/2006 | Matsuzawa et al. | 216/27 |
| 7,354,522 | B2 * | 4/2008 | Kneezel et al. | 216/37 |
| 7,494,209 | B2 * | 2/2009 | Bibl et al. | 347/68 |
| 7,497,962 | B2 * | 3/2009 | Tokunaga | 216/27 |
| 7,571,991 | B2 * | 8/2009 | Sugimoto | 347/68 |
| 7,631,962 | B2 * | 12/2009 | Bibl et al. | 347/87 |
| 7,634,855 | B2 * | 12/2009 | Tokunaga | 29/890.1 |
| 2003/0112300 | A1 * | 6/2003 | Chung et al. | 347/71 |
| 2010/0167433 | A1 * | 7/2010 | Lee et al. | 438/21 |

* cited by examiner

PIEZOELECTRIC INKJET PRINTHEAD AND METHOD OF MANUFACTURING THE SAME

CROSS-REFERENCE TO RELATED APPLICATIONS

This application is a divisional of prior application Ser. No. 11/468,954, filed Aug. 31, 2006 now U.S. Pat. No. 7,695,118, in the U.S. Patent and Trademark Office, which claims the benefit of Korean Patent Application No. 10-2006-08239, filed on Jan. 26, 2006, in the Korean Intellectual Property Office, the disclosures of which are incorporated herein in their entirety by reference.

BACKGROUND OF THE INVENTION

1. Field of the Invention

The present general inventive concept relates to an inkjet printhead, and more particularly, to a piezoelectric inkjet printhead formed of two silicon substrates using a micro-fabrication technology and a method of manufacturing the piezoelectric inkjet printhead.

2. Description of the Related Art

Generally, inkjet printheads are devices for printing a color image on a printing medium by ejecting droplets of ink onto a desired region of the printing medium. Depending on the ink ejecting method, the inkjet printheads can be classified into two types: thermal inkjet printheads and piezoelectric inkjet printheads. The thermal inkjet printhead generates bubbles in ink to be ejected by using heat and ejects the ink utilizing an expansion of the bubbles, and the piezoelectric inkjet printhead ejects ink using pressure generated by deforming a piezoelectric material.

FIG. 1 is a view illustrating a general structure of a conventional piezoelectric inkjet printhead. Referring to FIG. 1, a manifold 2, a restrictor 3, a pressure chamber 4, and a nozzle 5 are formed in a flow channel plate 1 to form an ink flow channel. A piezoelectric actuator 6 is formed on a top area of the flow channel plate 1. The manifold 2 allows an inflow of ink from an ink tank (not illustrated), and the restrictor 3 is a passage through which the ink flows from the manifold 2 to the pressure chamber 4. The pressure chamber 4 contains ink to be ejected and is deformed by an operation of the piezoelectric actuator 6. Thus, pressure inside the pressure chamber 4 varies, causing the ink to flow into or out of the pressure chamber 4.

Conventionally, the flow channel plate 1 is formed by individually fabricating a silicon substrate and a plurality of thin metal or synthetic resin plates to form the ink channel portion and by stacking the thin plates. The piezoelectric actuator 6 is formed on the top area 1*a* of the flow channel plate 1 above the pressure chamber 4 and configured with a piezoelectric layer and an electrode stacked on the piezoelectric layer to apply a voltage to the piezoelectric layer. Therefore, a portion of the flow channel plate 1 forming an upper wall of the pressure chamber 4 functions as a vibrating plate 1*a* that is deformed by the piezoelectric actuator 6.

An operation of the conventional piezoelectric inkjet printhead will now be described. When the vibrating plate 1*a* is bent downward by the operation of the piezoelectric actuator 6, a volume of the pressure chamber 4 reduces, which increases the pressure inside the pressure chamber 4, causing the ink to flow from the pressure chamber 4 to an outside of the printhead through the nozzle 5. When the vibrating plate 1*a* returns to an original shape after being bent downward according to the operation of the piezoelectric actuator 6, the volume of the pressure chamber 4 increases, which reduces the pressure of the pressure chamber 4, causing the ink to flow from the manifold 2 into the pressure chamber 4 through the restrictor 3.

An example of a conventional piezoelectric inkjet printhead is disclosed in U.S. Pat. No. 5,856,837. The disclosed piezoelectric inkjet printhead is formed by stacking and bonding a number of thin plates. To manufacture the disclosed piezoelectric inkjet printhead, a number of metal plates and ceramic plates are individually fabricated using various methods, and then the plates are stacked and bonded together using an adhesive. However, since the conventional piezoelectric inkjet printhead is formed of a relatively large number of plates, the number of plate-aligning processes increases and thereby a number of aligning errors also increases. In this case, ink cannot flow smoothly through an ink flow channel formed in the printhead, thereby deteriorating an ink ejecting performance of the printhead. Particularly, since recent printheads have a highly integrated structure for high resolution printing, precise alignment becomes very important in manufacturing the printhead. Further, precise aligning may influence a price of the printhead.

In addition, since the plates of the printhead are formed of different materials using different methods, the manufacturing process of the printhead is complicated and it is difficult to bond the plates, thereby decreasing a manufacturing yield of the printhead. Further, since the plates of the printhead are formed of different materials, the alignment of the plates may be affected or the plates may be deformed according to a temperature change due to different thermal expansion characteristics of the plates, even though the plates are precisely aligned and bonded together in the manufacturing process.

FIG. 2 is a view illustrating another example of a conventional piezoelectric inkjet printhead disclosed in Korean Patent Laid-Open Publication No. 2003-0050477 (U.S. Patent Application Publication No. 2003-0112300).

The piezoelectric inkjet printhead illustrated in FIG. 2 has a stacked structure formed by stacking and bonding three silicon substrates 30, 40, and 50. An upper substrate 30 includes pressure chambers 32 formed in a bottom surface thereof to a predetermined depth and an ink inlet 31 formed through one side thereof to connect with an ink reservoir (not illustrated). The pressure chambers 32 are arranged in two lines along both sides of a manifold 41 formed in a middle substrate 40. Piezoelectric actuators 60 are formed on a top surface of the upper substrate 30 to apply driving forces to the pressure chambers 32 for ejecting ink. The middle substrate 40 includes the manifold 41 connected with the ink inlet 31 and a plurality of restrictors 42 formed on both sides of the manifold 41 to connect with the respective pressure chambers 32. The middle substrate 40 further includes dampers 43 formed therethrough in a vertical direction at positions corresponding to the pressure chambers 32 formed in the upper substrate 30. A lower substrate 50 includes nozzles 51 connected with the dampers 43. Each of the nozzles 51 includes an ink introducing portion 51*a* formed in an upper portion of the lower substrate 50, and an ink ejecting hole 51*b* formed in a lower portion of the lower substrate 50. The ink introducing portion 51*a* is formed into a reversed pyramid shape by anisotropic wet etching, and the ink ejecting hole 51*b* is formed into a circular shape having a uniform diameter by dry etching.

As described above, since the inkjet printhead of FIG. 2 is configured with three stacked silicon substrates 30, 40, and 50, the number of substrates is reduced when compared with the inkjet printhead disclosed in U.S. Pat. No. 5,856,837, and thus the manufacturing process of the inkjet printhead can be simply performed with less substrate-aligning errors when compared with the inkjet printhead disclosed in U.S. Pat. No. 5,856,837.

However, the inkjet printhead manufactured using the three substrates 30, 40, and 50 has low driving frequency and high manufacturing costs.

Further, when a number of ink introducing portions 51*b* are formed by wet etching as described above, it is difficult to keep the ink introducing portions 51*b* at a constant depth such that a length of the ink introducing portions 51*b* may deviate from a desired value. In this case, an ink ejecting performance through the ink introducing portions 51*b* may vary, that is, an ejecting speed and volume of ink droplets may vary.

SUMMARY OF THE INVENTION

The present general inventive concept provides a piezoelectric inkjet printhead that is formed of two silicon substrates having identical nozzles to simplify a manufacturing process thereof and to improve an ink ejection performance thereof, and a method of manufacturing the piezoelectric inkjet printhead.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept may be achieved by providing a piezoelectric inkjet printhead, including an upper substrate including an ink inlet formed therethrough to allow an inflow of ink, a lower substrate formed of a silicon-on-insulator (SOI) substrate and including a manifold connected with the ink inlet, a plurality of pressure chambers arranged along at least one side of the manifold and connected with the manifold, a plurality of dampers connected with the pressure chambers, and a plurality of nozzles connected with the dampers, and a piezoelectric actuator formed on the upper substrate to apply a driving force to the plurality of pressure chambers to eject the ink, wherein the upper substrate is stacked and bonded on the lower substrate.

The SOI substrate may include a first silicon layer, an intervening oxide layer, and a second silicon layer including the manifold, the pressure chambers, and the dampers formed therein, and the nozzles may be formed through the first silicon layer and the intervening oxide layer.

The dampers may have a depth substantially equal to a thickness of the second silicon layer between the upper substrate and the intervening oxide layer functioning as an etch stop layer, and the nozzles may have a length substantially equal to a total thickness of the first silicon layer and the intervening oxide layer or substantially equal to a thickness of the first silicon layer. The manifold may have a depth smaller than the thickness of the second silicon layer, and the pressure chambers may have a depth smaller than the depth of the manifold.

The upper substrate may be formed of a single crystal silicon substrate or an SOI substrate. The upper substrate may function as a vibrating plate deformable by an operation of the piezoelectric actuator.

The manifold, the pressure chambers, and the dampers may include inclined sidewalls formed by wet etching or vertical sidewalls formed by dry etching with respect to an ink ejecting direction. First and second ends of each of the plurality of pressure chambers may taper toward the manifold and corresponding ones of the plurality of damper, respectively, and be connected to the manifold and corresponding ones of the plurality of dampers, respectively.

The nozzles may be formed into a vertical hole shape having a constant diameter by dry etching.

The foregoing and/or other aspects and utilities of the present general inventive concept may also be achieved by providing a method of manufacturing a piezoelectric inkjet printhead, including processing a lower SOI substrate having a sequentially stacked structure with a first silicon layer, an intervening oxide layer, and a second silicon layer by etching the second silicon layer to form a manifold, a plurality of pressure chambers arranged along at least one side of the manifold and connected with the manifold, and a plurality of dampers connected with the pressure chambers, and by etching the first silicon layer and the intervening oxide layer to form a plurality of vertical nozzles through the first silicon layer and the intervening oxide layer to corresponding ones of the plurality of dampers, stacking and bonding an upper substrate on the lower substrate, reducing the upper substrate to a predetermined thickness, and forming a piezoelectric actuator on the upper substrate to apply a driving force to the respective pressure chambers to eject ink.

The dampers may be formed to have a depth substantially equal to a thickness of the second silicon layer by etching the second silicon layer using the intervening oxide layer as an etch stop layer, and the nozzles may be formed to have a length substantially equal to a total thickness of the first silicon layer and the intervening oxide layer or substantially equal to a thickness of the first silicon layer.

The manifold may have a depth smaller than the thickness of the second silicon layer, and the pressure chambers may have a depth smaller than the depth of the manifold.

The processing of the lower substrate may include forming a first etch mask on a top surface of the second silicon layer, the first etch mask including a first opening corresponding to the manifold, second openings corresponding to the pressure chambers, and third openings corresponding to the dampers, forming a second etch mask on the top surface of the second silicon layer and a top surface of the first etch mask, the second etch mask covering the second openings and opening the first and third openings, forming a third etch mask on the top surface of the second silicon layer and a top surface of the second etch mask, the third etch mask covering the first and second openings and opening the third openings, and forming the manifold, the pressure chambers, and the dampers by etching the second silicon layer of the lower substrate sequentially using the third etch mask, the second etch mask, and the first etch mask.

The manifold, the pressure chambers, and the dampers may include sidewalls inclined with respect to an ink ejecting direction by wet etching the second silicon layer of the lower substrate. First and second ends of each of the plurality of pressure chambers may taper toward the manifold and corresponding ones of the plurality of dampers, respectively, and may be connected to the manifold and the corresponding ones of the plurality of dampers, respectively. The first opening, the second openings, and the third openings may be spaced from each other by a predetermined distance. The first and second etch masks may be formed of silicon oxide layers, and the third etch mask may be formed of at least one layer selected from the group consisting of a silicon oxide layer, a parylene layer, and a Si3N4 layer. The wet etching of the second silicon layer of the lower substrate may be performed using TMAH (tetramethyl ammonium hydroxide) or KOH as a silicon etchant.

Meanwhile, the manifold, the pressure chambers, and the dampers may include sidewalls vertically formed with respect to an ink ejecting direction by dry etching the second silicon layer of the lower substrate. First and second ends of the second openings may be connected to the first opening and the third openings, respectively. The first and second etch masks may be formed of silicon oxide layers, and the third etch mask may be formed of at least one layer selected from the group consisting of a silicon oxide layer, a photoresist layer, and a Si3N4 layer. The dry etching of the second silicon layer of the lower substrate may include performing RIE (reactive ion etching) using ICP (inductively coupled plasma).

The nozzles may be formed into a vertical hole shape having a constant diameter by dry etching the first silicon layer and the intervening oxide layer of the lower substrate. The dry etching of the first silicon layer and the intervening oxide layer of the lower substrate may include performing RIE using ICP.

The upper substrate may be formed of a single crystal silicon substrate or an SOI substrate.

The method may further include forming an ink inlet in the upper substrate, the ink inlet being connected with the manifold. The forming of the ink inlet may be performed prior to the stacking and bonding of the upper substrate or after the reducing of the upper substrate. The forming of the ink inlet may include performing dry or wet etching.

The bonding of the upper substrate on the lower substrate may include performing SDB (silicon direct bonding) to bond the upper substrate and the lower substrate.

The reducing of the upper substrate may include performing dry etching, wet etching, or CMP (chemical-mechanical polishing).

The forming of the piezoelectric actuator may include forming a lower electrode on the upper substrate, forming a plurality of piezoelectric layers on the lower electrode, the piezoelectric layers corresponding to the pressure chambers, forming an upper electrode on each of the piezoelectric layers, and performing polling on the respective piezoelectric layers by applying an electric field to the piezoelectric layers to activate a piezoelectric characteristic of the piezoelectric layers.

The foregoing and/or other aspects and utilities of the present general inventive concept may also be achieved by providing a printhead, including an upper silicon substrate including an ink inlet to allow an inflow of ink into the printhead, a lower silicon substrate having first and second silicon layers separated by an intervening oxide layer, the first silicon layer and the intervening layer including a plurality of nozzles to eject the ink, and the second silicon layer including a plurality of pressure chambers to contain the ink, a manifold to supply the ink from the ink inlet to the pressure chambers, and a plurality of dampers to connect the nozzles to the plurality of pressure chambers, and an ink flow path defined by the ink inlet, the manifold, the plurality of pressure chambers, the plurality of dampers, and the plurality of nozzles.

Each of the dampers may include a first end connected to a corresponding one of the plurality of pressure chambers and having a first size, and a second end connected to a corresponding one of the plurality of nozzles and having a second size that is smaller than the first size. Each of the dampers may include a first end connected to a corresponding one of the plurality of pressure chambers, a second end connected to a corresponding one of the plurality of nozzles, and sloped sidewalls extending from the first end to the second end. Each of the dampers may include the first end connected to the corresponding one of the plurality of pressure chambers, the second end connected to the corresponding one of the plurality of nozzles, and vertical sidewalls extending from the first end to the second end.

Each of the manifold, the plurality of pressure chambers, and the plurality of dampers may have sloped sidewalls. Each of the manifold, the plurality of pressure chambers, and the plurality of dampers may have vertical sidewalls. A thickness of the first silicon layer may be about 30 μm to about 100 μm, a thickness of the intervening oxide layer may be about 0.3 μm to about 2 μm, and a thickness of the second silicon layer may be about 200 μm. A depth of each of the plurality of dampers may correspond to a thickness of the second silicon layer. A length of each of the plurality of nozzles may correspond to thicknesses of the intervening oxide layer and the first silicon layer. Each of the plurality of nozzles may have a constant diameter. The upper substrate may have a thickness of about 5 μm to about 13 μm.

The foregoing and/or other aspects and utilities of the present general inventive concept may also be achieved by providing a piezoelectric printhead, including an upper silicon substrate including an ink inlet and a piezoelectric actuator, and a lower silicon substrate including a first layer having a plurality of nozzles, a second layer having a plurality of pressure chambers, a manifold, and a plurality of dampers, and an etch stop layer such that the plurality of nozzles has a uniform shape.

The foregoing and/or other aspects and utilities of the present general inventive concept may also be achieved by providing a method of manufacturing a printhead including an upper silicon substrate having an ink inlet and a piezoelectric actuator and a lower silicon substrate having first and second silicon layers separated by an intervening oxide layer, the method including forming a manifold, a plurality of pressure chambers, and a plurality of dampers in the second silicon layer of the lower silicon substrate, forming a plurality of nozzles in the intervening oxide layer and the first silicon layer of the lower silicon substrate, and attaching the upper and lower silicon substrates together to form an ink flow path defined by the ink inlet, the manifold, the plurality of pressure chambers, the plurality of dampers, and the plurality of nozzles.

The forming of the manifold, the plurality of pressure chambers, and the plurality of dampers may include wet etching the second silicon layer of the lower substrate to form the manifold, the plurality of pressure chambers, and the plurality of dampers in the second silicon layer. The wet etching of the second silicon layer may include wet etching first portions of the second silicon layer to a first predetermined depth corresponding to a thickness of the second silicon layer to form the plurality of dampers, wet etching second portions of the second silicon layer to a second predetermined depth to form the plurality of pressure chambers, and wet etching a third portion of the second silicon layer to a third predetermined depth to form the manifold.

The forming of the manifold, the plurality of pressure chambers, and the plurality of dampers may include dry etching the second silicon layer of the lower substrate to form the manifold, the plurality of pressure chambers, and the plurality of dampers in the second silicon layer. The dry etching of the second silicon layer may include dry etching first portions of the second silicon layer to a first predetermined depth corresponding to a thickness of the second silicon layer to form the plurality of dampers, dry etching second portions of the second silicon layer to a second predetermined depth to form the plurality of pressure chambers, and dry etching a third portion of the second silicon layer to a third predetermined depth to form the manifold.

The forming of the plurality of nozzles may include dry etching the intervening layer and the first silicon layer of the lower substrate to form the plurality of nozzles in the intervening layer and the first silicon layer. The dry etching of the intervening layer and the first silicon layer may include dry etching a portion of the intervening layer and the first silicon layer to a predetermined depth corresponding to thicknesses of the intervening oxide layer and the first silicon layer.

The foregoing and/or other aspects and utilities of the present general inventive concept may also be achieved by providing a method of manufacturing a piezoelectric inkjet printhead, the method including forming an ink inlet on an upper substrate allow an inflow of ink, forming a manifold to connect with the ink inlet, a plurality of pressure chambers arranged along at least one side of the manifold and connected with the manifold, a plurality of dampers connected with the pressure chambers, and a plurality of nozzles connected with the dampers on a lower substrate formed of a silicon-on-insulator substrate, and forming a piezoelectric actuator on the upper substrate to apply a driving force to the plurality of pressure chambers to eject the ink, and the upper substrate is stacked and bonded on the lower substrate.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
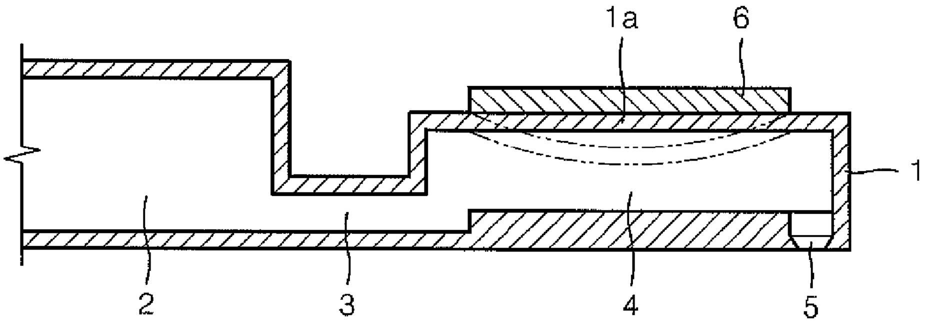
FIG. 1 (RELATED ART)
FIG. 1 is a sectional view illustrating a general structure of a conventional piezoelectric inkjet printhead.
Figure 2:
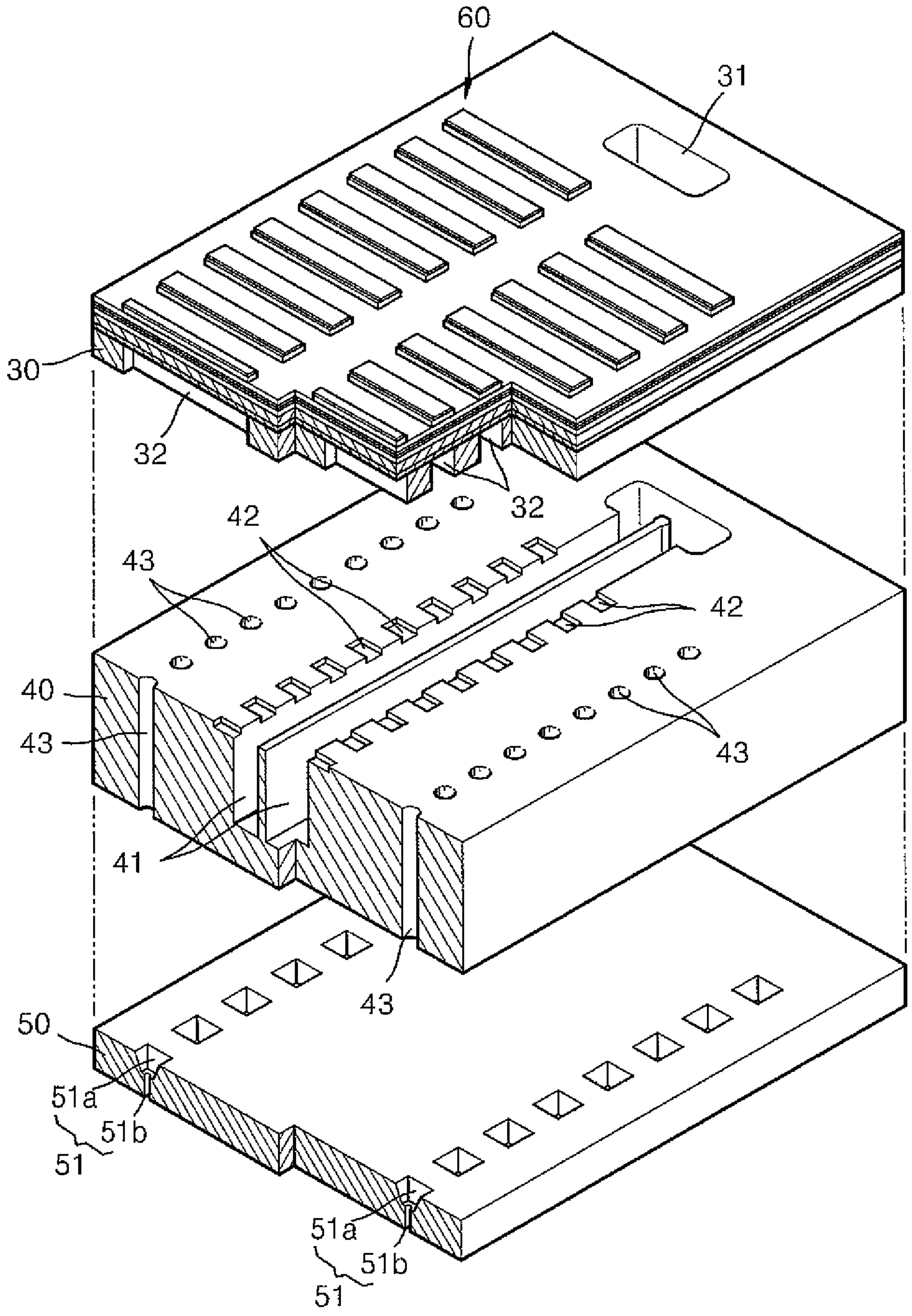
FIG. 2 (RELATED ART)
FIG. 2 is an exploded perspective view illustrating a specific example of another conventional piezoelectric inkjet printhead.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. The thicknesses of layers and regions are exaggerated for clarity. It will also be understood that when a layer is referred to as being "on" another layer or substrate, it can be directly on the other layer or substrate, or intervening layers may be present therebetween.

Figure 3A:
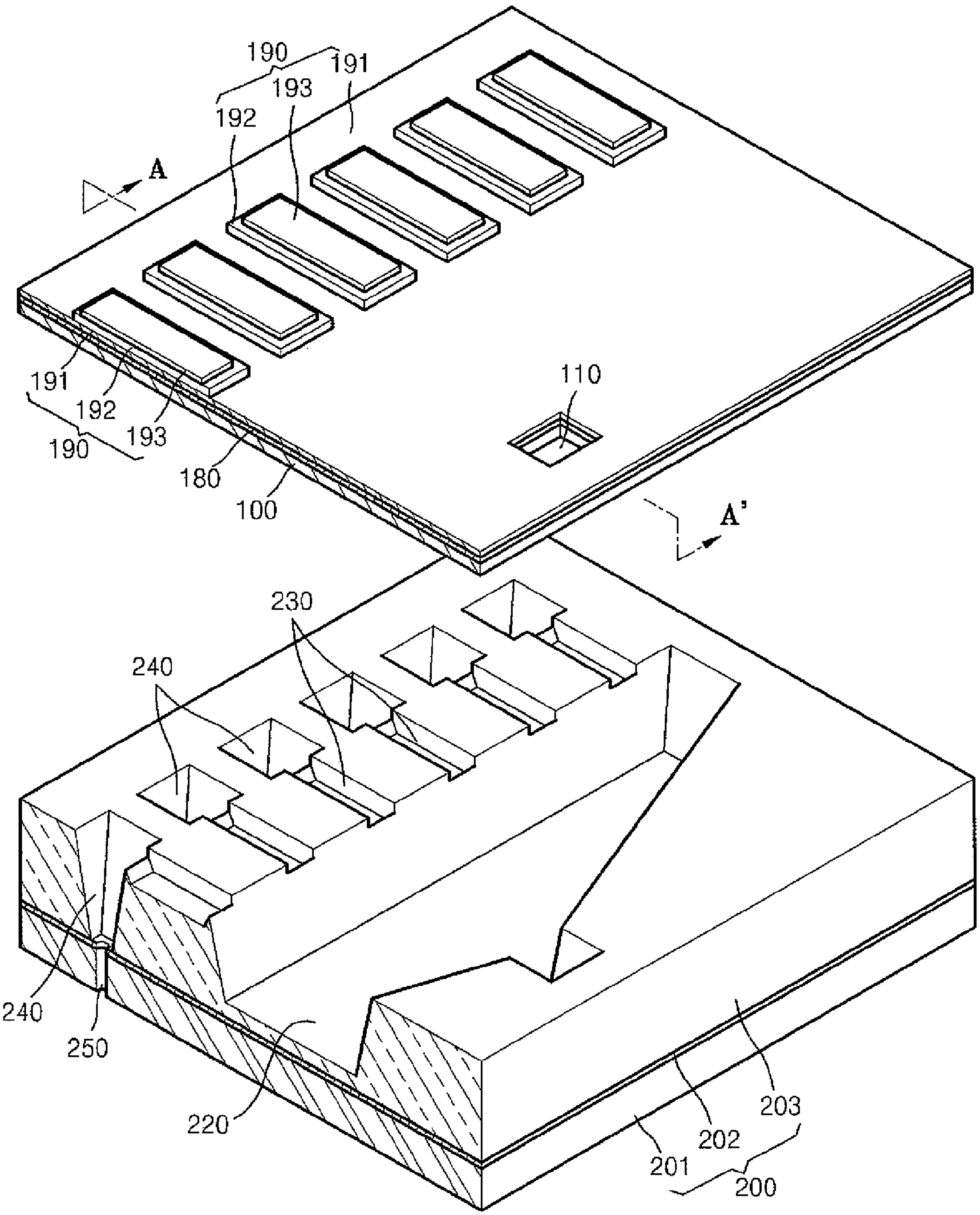
FIG. 3A is an exploded perspective view illustrating a part of a piezoelectric inkjet printhead according to an embodiment of the present general inventive concept.
Figure 3B:
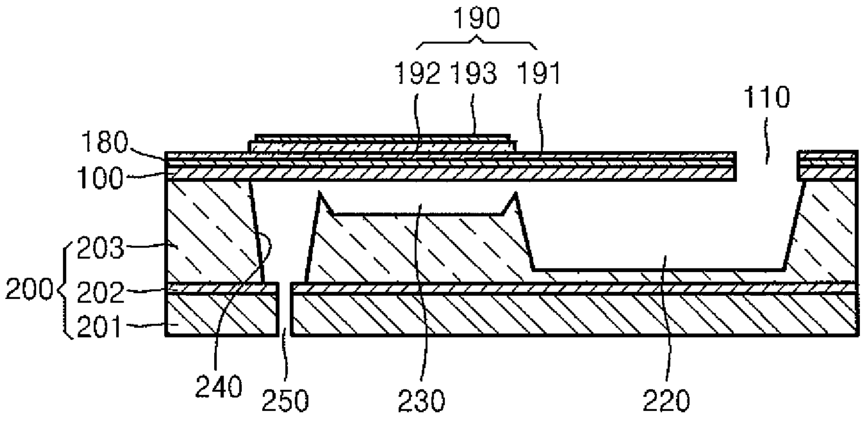
FIG. 3B is a vertical section along line A-A' of FIG. 3A.

FIG. 3A is an exploded perspective view illustrating a part of a piezoelectric inkjet printhead according to an embodiment of the present general inventive concept, and FIG. 3B is a vertical section along line A-A' of FIG. 3A.

Referring to FIGS. 3A and 3B, the piezoelectric inkjet printhead according to the present embodiment is formed by bonding two substrates together: an upper substrate 100 and a lower substrate 200. An ink flow channel is formed in the upper and lower substrates 100 and 200, and piezoelectric actuators 190 are formed on a top surface of the upper substrate 100 to generate driving forces to eject ink.

The ink flow channel includes an ink inlet 110 to allow an inflow of ink from an ink reservoir (not illustrated), a plurality of pressure chambers 230 to contain ink to be ejected by pressure variations, a manifold 220 to supply the ink introduced through the ink inlet 110 to the pressure chambers 230, a plurality of nozzles 250 to eject the ink contained in the pressure chambers 230, and a plurality of dampers 240 to connect the pressure chambers 230 with the nozzles 250.

Specifically, the lower substrate 200 is formed of a silicon-on-insulator (SOI) wafer that may also be used to form a semiconductor integrated circuit. The SOI wafer may have a stacked structure including a first silicon layer 201, an intervening oxide layer 202 formed on the first silicon layer 201, and a second silicon layer 203 bonded to the intervening oxide layer 202. The first and second silicon layers 201 and 203 may be formed of single crystal silicon, and the intervening oxide layer 202 may be formed by oxidizing a surface of the first silicon layer 201. Thicknesses of the first silicon layer 201, the intervening oxide layer 202, and the second silicon layer 203 may be properly determined based on a length of the nozzles 250, a depth of the dampers 240, and a depth of the manifold 220. For example, the first silicon layer 201 may have a thickness of about 30 μm to about 100 μm, the intervening oxide layer 202 may have a thickness of about 0.3 μm to about 2 μm, and the second silicon layer 203 may have a thickness of about several hundreds μm (e.g., about 210 μm). By forming the lower substrate 200 using the SOI wafer, the depth of the dampers 240 and the length of the nozzles 250 can be precisely adjusted. In detail, when the dampers 240 are formed in the lower substrate 200, the intervening oxide layer 202 of the SOI wafer functions as an etch stop layer. Therefore, the depth of the dampers 240 can be easily set by determining the thickness of the second silicon layer 203, and the length of the nozzles 250 can be easily set by determining the thickness of the first silicon layer 201.

The manifold 220, the pressure chambers 230, the dampers 240, and the nozzles 250 are formed in the lower substrate 200 formed of the SOI wafer as described above. The manifold 220 is formed in a top surface of the second silicon layer 203 of the lower substrate 200 to a predetermined depth in communication with the ink inlet 110 formed in the upper substrate 100. The pressure chambers 230 may be arranged in a row along one side of the manifold 220.

Meanwhile, though not illustrated in FIG. 3A, the manifold 220 may be elongated in one direction, and the pressure chambers 230 may be arranged in two rows along both sides of the manifold 220. In this case, the ink inlet 110 may be connected to one end or both ends of the manifold 220.

Each of the pressure chambers 230 may be formed in the top surface of the second silicon layer 203 of the lower substrate 200 to a predetermined depth, and the pressure chambers 230 may be shallower than the manifold 220. Each pressure chamber 230 may have a cuboidal shape elongated in a direction of ink flow. Each pressure chamber 230 may have a first end connected with the manifold 220 and a second end connected with the damper 240.

The dampers 240 may be formed through the second silicon layer 203 to connect to respective ones of the second ends of the pressure chambers 230.

The manifold 220, the pressure chambers 230, and the dampers 240 may be formed by wet etching (described later). Therefore, sidewalls of the manifold 220, the pressure chambers 230, and the dampers 240 can be sloped by an anisotropic characteristic of the wet etching. In this case, both ends of the pressure chamber 230, to which the manifold 220 and the damper 240 are respectively connected, become narrower toward the manifold 220 and the damper 240. That is, narrow passages are respectively formed in both ends of the pressure chamber 230. The narrow passage connected to the manifold 220 functions as a restrictor to prevent reverse flow of ink from the pressure chamber 230 to the manifold 220 when the ink is ejected. Each of the dampers 240 may be formed into a reversed pyramid shape, for example, by wet etching. The damper 240 may have a depth equal to the thickness of the second silicon layer 203 since the intervening oxide layer 202 functions as an etch stop layer as described above.

Each of the nozzles 250 may be vertically formed through the first silicon layer 201 and the intervening layer 202 of the lower substrate 200 to the damper 240. Each nozzle 250 may have a vertical hole shape with a constant diameter. Further, each nozzle 250 may be formed by dry etching.

The upper substrate 100 may function as a vibrating plate deformable by the piezoelectric actuators 190. The upper substrate 100 may be formed of single crystal silicon or an SOI substrate (described later). A thickness of the upper substrate 100 may be determined based on the size of the pressure chambers 230 and a magnitude of a driving force to eject the ink. For example, the upper substrate 100 may have a thickness of about 5 μm to about 13 μm.

The ink inlet 110 may be formed by, for example, dry or wet etching in the upper substrate 100.

The piezoelectric actuators 190 are formed on the upper substrate 100. A silicon oxide layer 180 may be formed between the piezoelectric actuators 190 and the upper substrate 100. The silicon oxide layer 180 may function as an insulating layer to prevent diffusion between the upper substrate 100 and the piezoelectric actuators 190. Further, the silicon oxide layer 180 may adjust a thermal stress between the upper substrate 100 and the piezoelectric actuators 190. Each of the piezoelectric actuators 190 may include a lower electrode 191 as a common electrode, a piezoelectric layer 192 bendable in response to an applied voltage, and an upper electrode 193 as a driving electrode. The lower electrode 191 is formed on the entire surface of the silicon oxide layer 180. The lower electrode 191 may include two thin metal layers of, for example, titanium (Ti) and platinum (Pt), rather than a single conductive metal layer. The lower electrode 191 functions as a common electrode and a diffusion barrier layer to prevent inter-diffusion between the piezoelectric layer 192 and the upper substrate 100. The piezoelectric actuator 192 is formed on the lower electrode 191 above each of the pressure chambers 230. The piezoelectric layer 192 may be formed of a lead zirconate titanate (PZT) ceramic material. When a voltage is applied to the piezoelectric layer 192, the piezoelectric layer 192 is deformed, thereby bending the upper substrate 100 above the pressure chamber 230. The upper electrode 193 is formed on the piezoelectric layer 192 to apply the voltage to the piezoelectric layer 192.

After forming the two substrates 100 and 200 as described above, the two substrates 100 and 200 are stacked and bonded together to form the piezoelectric inkjet printhead of the present embodiment, as illustrated in FIGS. 3A and 3B. In the piezoelectric inkjet printhead of the present embodiment, the ink inlet 110, the manifold 220, the pressure chambers 230, the dampers 240, and the nozzles 250 may be sequentially connected to form the ink flow channel.

Figure 4A:
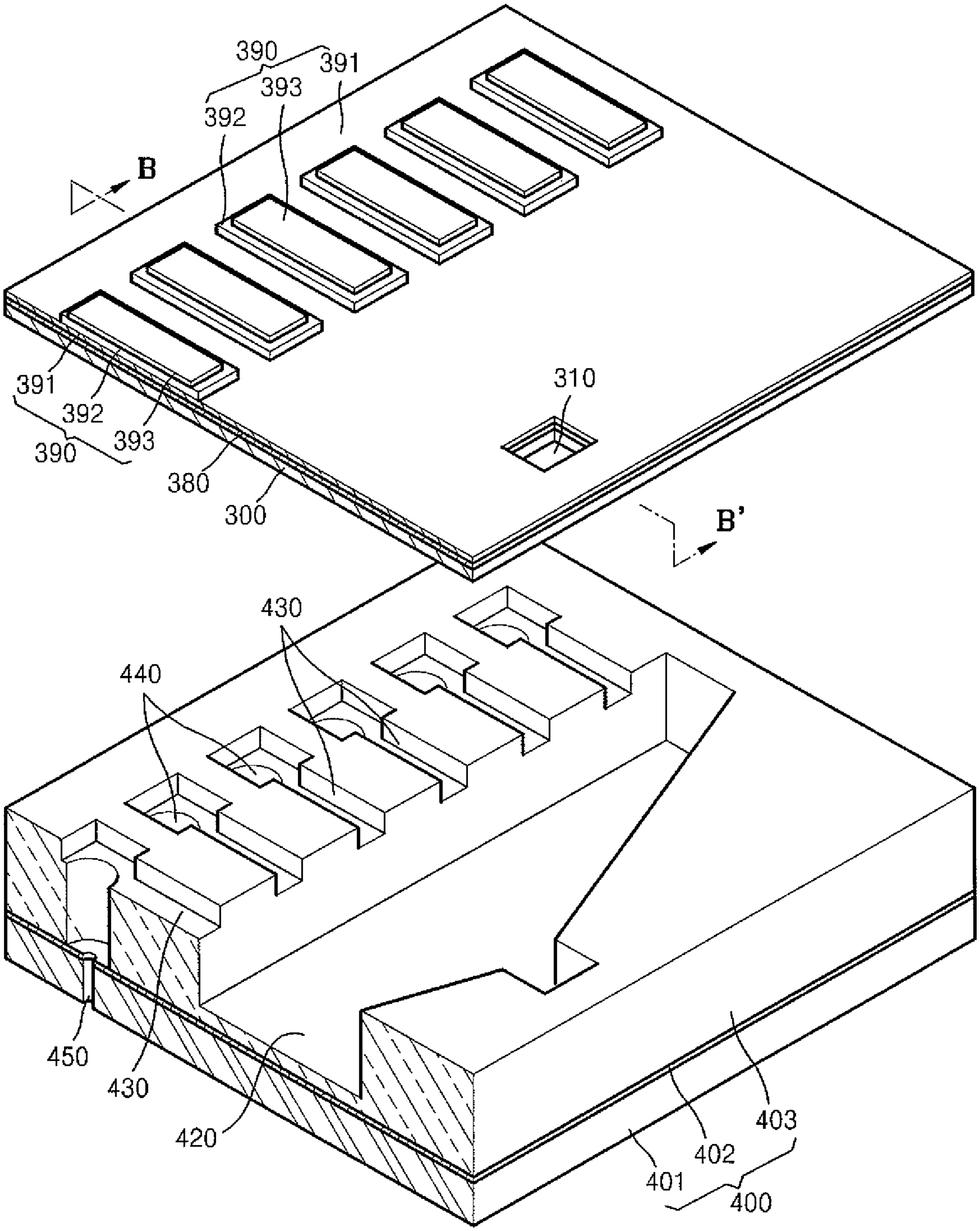
FIG. 4A is an exploded perspective view illustrating a part of a piezoelectric inkjet printhead according to another embodiment of the present general inventive concept.
Figure 4B:
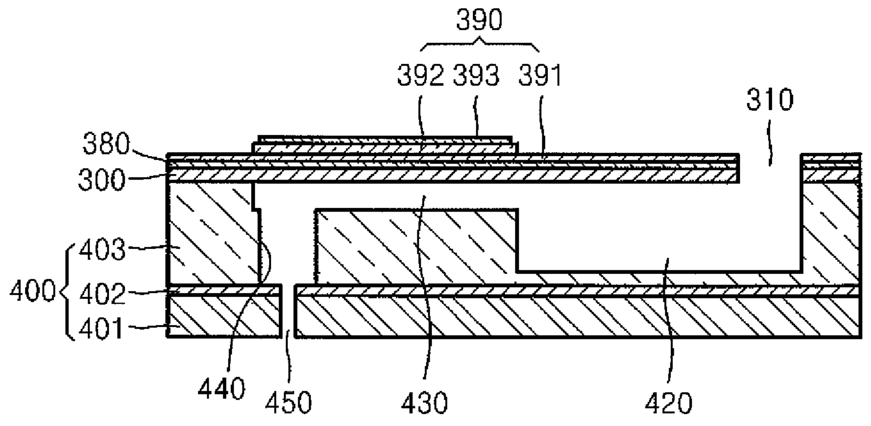
FIG. 4B is a vertical sectional view taken along line B-B' of FIG. 4A.

FIG. 4A is an exploded perspective view illustrating a part of a piezoelectric inkjet printhead according to another embodiment of the present general inventive concept, and FIG. 4B is a vertical sectional view along line B-B' of FIG. 3A. The piezoelectric inkjet printhead illustrated in FIGS. 4A and 4B has the same structure as the piezoelectric inkjet printhead illustrated in FIGS. 3A and 3B, except that a manifold 420, a plurality of pressure chambers 430, and dampers 440 are formed by dry etching to make the sidewalls thereof vertical.

Referring to FIGS. 4A and 4B, the piezoelectric inkjet printhead is formed by bonding two substrates together: an upper substrate 300 and a lower substrate 400. An ink flow channel is formed in the upper and lower substrates 300 and 400, and piezoelectric actuators 390 are formed on a top surface of the upper substrate 300 to generate driving forces to eject ink.

Like in the previous embodiment illustrated in FIGS. 3A and 3B, the lower substrate 400 is formed of a silicon-on-insulator (SOI) wafer having a stacked structure with a first silicon layer 401, an intervening oxide layer 402 as an etch stop layer formed on the first silicon layer 401, and a second silicon layer 403 bonded to the intervening oxide layer 402. The first silicon layer 401, the intervening oxide layer 402, and the second silicon layer 403 have thicknesses corresponding to the thicknesses of the first silicon layer 201, the intervening oxide layer 202, and the second silicon layer 203 of the previous embodiment illustrated in FIGS. 3A and 3B.

The lower substrate 400 is formed with the manifold 420, the plurality of pressure chambers 430, the plurality of dampers 440, and a plurality of nozzles 450, which are disposed in the same manner as the manifold 220, the plurality of pressure chambers 230, the plurality of dampers 240, and a plurality of nozzles 250 of the previous embodiment illustrated in FIGS. 3A and 3B. The manifold 420, the pressure chambers 430, and the dampers 440 are formed in the second silicon layer 403 of the lower substrate 400, for example, by dry etching. Therefore, sidewalls of the manifold 420, the pressure chambers 430, and the dampers 440 are vertically formed. Further, the dampers 440 may be formed into a circular hole shape instead of a reversed pyramid shape. The dampers 440 have a constant depth since the intervening oxide layer 402 functions as the etch stop layer.

Like the nozzles 250 of the previous embodiment illustrated in FIGS. 3A and 3B, each of the nozzles 450 may be formed through the first silicon layer 401 and the intervening oxide layer 402 of the lower substrate 400. The nozzle 450 may be formed into a vertical hole shape with a constant diameter, for example, by dry etching.

The upper substrate 300 may function as a vibrating plate deformable by the piezoelectric actuators 390. The upper substrate 300 may be formed of single crystal silicon or an SOI substrate (described later). An ink inlet 310 is vertically formed through the upper substrate 300 by dry or wet etching. Each of the piezoelectric actuators 390 is formed on the upper substrate 300 and has a sequentially stacked structure with a lower electrode 391, a piezoelectric layer 392, and an upper electrode 393. A silicon oxide layer 380 may be formed between the piezoelectric actuators 390 and the upper substrate 300. The upper substrate 300 and the piezoelectric actuators 390 have the same structure as the upper substrate 100 and the piezoelectric actuators 190 of the previous embodiment illustrated in FIGS. 3A and 3B. Thus, descriptions thereof will be omitted.

After forming the two substrates 300 and 400 as described above, the two substrates 300 and 400 are stacked and bonded together to form the piezoelectric inkjet printhead of the present embodiment as illustrated in FIGS. 4A and 4B.

An operation of the piezoelectric inkjet printhead of the present general inventive concept will now be described based on the embodiment illustrated in FIGS. 3A and 3B. Referring to FIGS. 3A and 3B, the ink is introduced from the ink reservoir (not illustrated) into the manifold 220 through the ink inlet 110, and then the ink is supplied to each of the pressure chambers 230. After each pressure chamber 230 is filled with the ink, a voltage is applied to the piezoelectric layer 192 through the upper electrode 193 to deform the piezoelectric layer 192. By the deformation of the piezoelectric layer 192, the upper substrate 100 (functioning as a vibrating layer) is bent downward, thereby decreasing the volume of the pressure chamber 230 and thus increasing the pressure of the pressure chamber 230. Therefore, the ink contained in the pressure chamber 230 is ejected to the outside of the printhead through the nozzle 250.

When the voltage applied to the piezoelectric layer 192 is interrupted, the piezoelectric layer 192 returns to the original shape thereof, and thus the upper substrate 100 returns to the original shape thereof, thereby increasing the volume of the pressure chamber 230 and thus decreasing the pressure of the pressure chamber 230. Therefore, the ink is supplied from the manifold 220 to the pressure chamber 230 by the pressure decrease inside the pressure chamber 230 and an ink meniscus is formed in the nozzle 250 due to a surface tension of the ink.

A method of manufacturing a piezoelectric inkjet printhead according to an embodiment of the present general inventive concept will now be described. Briefly, an upper substrate and a lower substrate are individually fabricated to form elements of an ink flow channel in the upper substrate and the lower substrate, and then the two substrates are stacked and bonded together. After that, piezoelectric actuators are formed on the upper substrate, thereby manufacturing the piezoelectric inkjet printhead of the present embodiment. Meanwhile, the upper substrate and the lower substrate may be fabricated in any order. That is, the lower substrate may be fabricated prior to the upper substrates, or the two substrates may be fabricated at the same time.

First, a method of manufacturing the piezoelectric inkjet printhead of FIGS. 3A and 3B according to an embodiment of the present general inventive concept will now be described with reference to FIGS. 5A through 8.

FIGS. 5A through 5D are views illustrating a forming of the ink inlet 110 in the upper substrate 100 of the piezoelectric inkjet printhead illustrated in FIGS. 3A and 3B according to an embodiment of the present general inventive concept.

Figure 5A:
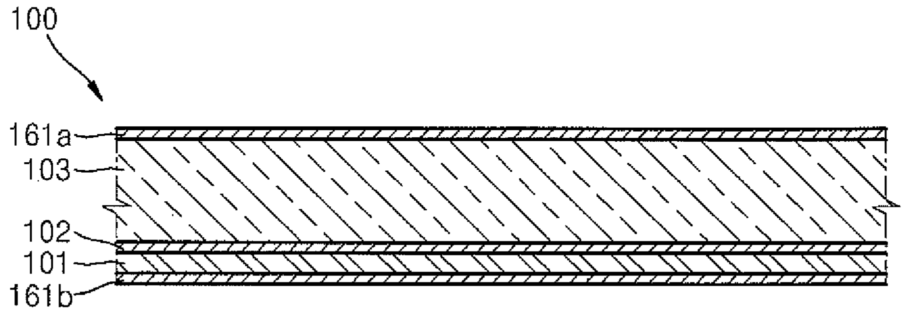
FIGS. 5A through 5D are views illustrating a forming of an inlet in an upper substrate of the piezoelectric inkjet printhead of FIGS. 3A and 3B according to an embodiment of the present general inventive concept.

Referring to FIG. 5A, the upper substrate 100 is formed using an SOI substrate including the first silicon layer 101 with a thickness of about 5 μm to about 13 μm, the intervening oxide layer 102 with a thickness of about 0.3 μm to about 2 μm, and the second silicon layer 103 with a thickness of about 100 μm to about 150 μm. The upper substrate 100 is wet and/or dry oxidized to form silicon oxide layers 161*a* and 161*b* on top and bottom surfaces thereof, respectively, to a thickness of about 5,000 Å to 15,000 Å.

Figure 5B:
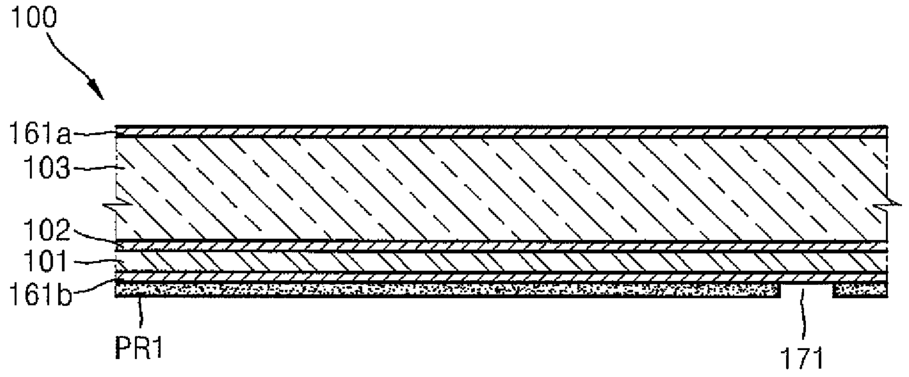

Referring to FIG. 5B, a photoresist $PR_1$ is formed on the silicon layer 161*b* formed on the bottom surface of the upper substrate 100. Next, the photoresist $PR_1$ is patterned to form an opening 171 for the ink inlet 110 illustrated in FIG. 3A. The patterning of the photoresist $PR_1$ may be performed using, for example, a well-known photolithography method including exposing and developing operations. Other photoresists described hereinafter may be patterned using the same method.

Figure 5C:
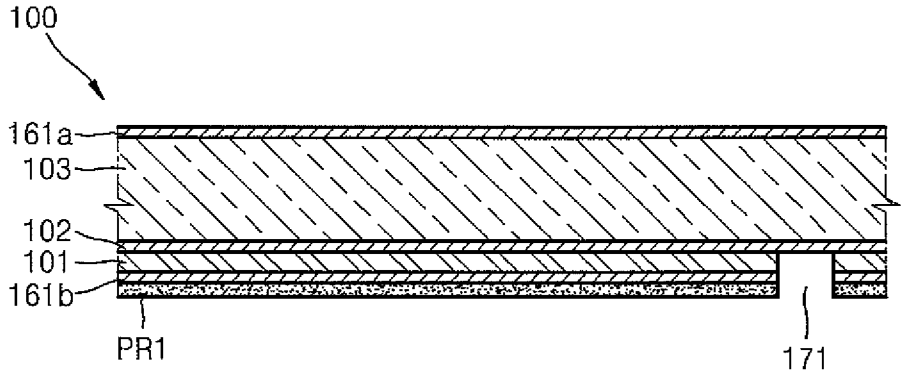

Referring to FIG. 5C, the silicon oxide layer 161*b* is etched using the patterned photoresist $PR_1$ as an etch mask to remove an exposed portion of the silicon oxide layer 161*b* by the patterned photoresist $PR_1$. The first silicon layer 101 of the upper substrate 100 is then etched. Here, the etching of the silicon oxide layer 161*b* may be performed by a dry etching method, such as reactive ion etching (RIE), or a wet etching method, such as a wet etching method using a buffered oxide etchant (BOE). The etching of the first silicon layer 101 of the upper substrate 100 may be performed by a dry etching method, such as RIE using inductively coupled plasma (ICP), or a wet etching method, such as a wet etching method using a silicon etchant, such as tetramethyl ammonium hydroxide (TMAH) or KOH. The above-described method of etching the silicon oxide layer 161*b* using the photoresist $PR_1$ may be used to etch other silicon oxide layers described hereinafter.

Figure 5D:
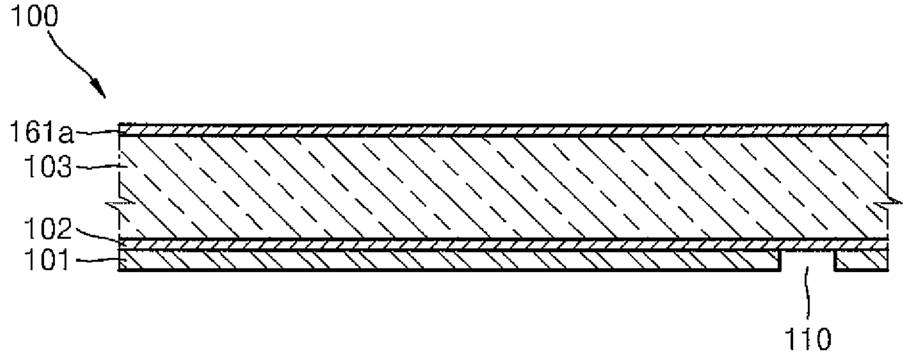

Referring to FIG. 5D, the photoresist $PR_1$ and the silicon oxide layers 161*a* and 161*b* are removed to form the ink inlet 110 in the first silicon layer 101 of the upper substrate 100.

Although the photoresist $PR_1$ is illustrated as being removed after the silicon oxide layer 161*b* and the first silicon oxide layer 101 are etched, the photoresist $PR_1$ can instead be removed after the silicon oxide layer 161*b* is etched using the photoresist $PR_1$ as an etch mask, and then the first silicon layer 101 can be etched using the etched silicon oxide layer 161*b* as an etch mask.

Further, although the upper substrate 100 is illustrated as being formed using the SOI substrate, the upper substrate 100 can instead be formed using a single crystal silicon substrate. In this case, a single crystal silicon substrate with a thickness of about 100 μm to about 200 μm may be prepared, and then the ink inlet 110 may be formed in the single silicon substrate using the same method illustrated in FIGS. 5A through 5D.

FIGS. 6A through 6K are views illustrating a forming of the manifold 220, the plurality of pressure chambers 230, the plurality of dampers 240, and the plurality of nozzles 250 in the lower substrate 200 of the piezoelectric inkjet printhead illustrated in FIGS. 3A and 3B according to an embodiment of the present general inventive concept.

Figure 6A:
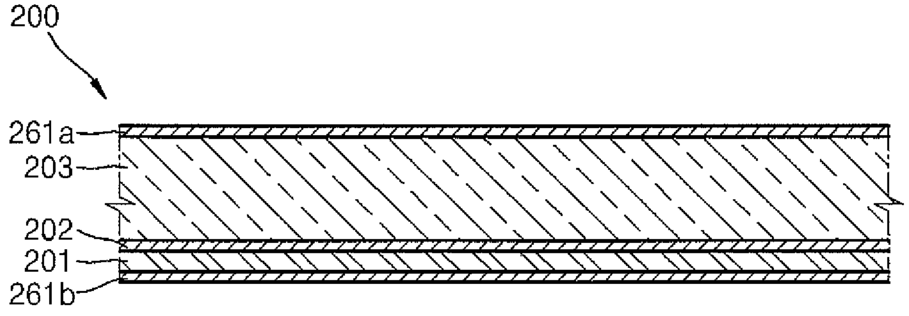
FIGS. 6A through 6K are views illustrating a forming of a manifold, a plurality of pressure chambers, a plurality of dampers, and a plurality of nozzles in a lower substrate of the piezoelectric inkjet printhead of FIGS. 3A and 3B according to an embodiment of the present general inventive concept.

Referring to FIG. 6A, the lower substrate 200 is formed using an SOI substrate including the first silicon layer 201 with a thickness of about 30 μm to about 100 μm, the intervening oxide layer 202 with a thickness of about 1 μm to about 2 μm, and the second silicon layer 203 with a thickness of about several hundreds μm (e.g., about 210 μm). By using the SOI substrate, the depths of the dampers 240 (see FIG. 3A) and the nozzles 250 (see FIG. 3A) can be precisely adjusted.

The lower substrate 200 is wet and/or dry oxidized to form first silicon oxide layers 261*a* and 261*b* on top and bottom surfaces thereof, respectively, to a thickness of about 5,000 Å to 15,000 Å.

Figure 6B:
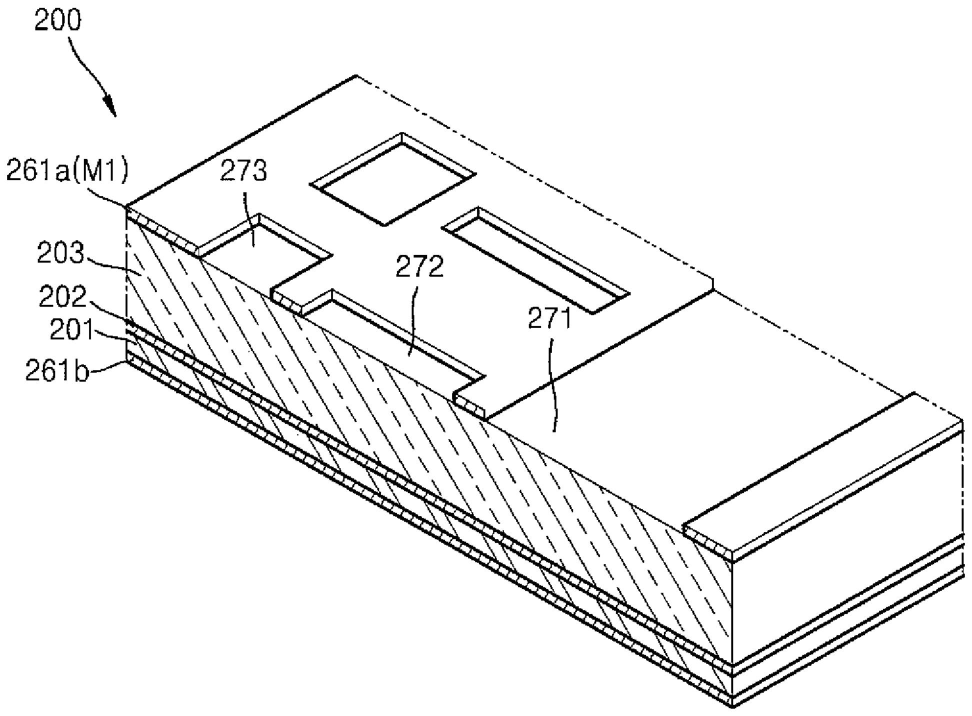

Referring to FIG. 6B, the first silicon oxide layer 261*a* formed on the top surface of the lower substrate 200 is partially etched to form a first opening 271 for the manifold 220 illustrated in FIG. 3A and FIGS. 6*h* through 6K, second openings 272 for the pressure chambers 230, and third openings 273 for the dampers 240. Here, the openings 271, 272, and 273 are spaced predetermined distances apart from each other. As described above, the etching of the first silicon oxide layer 261*a* may be performed using a patterned photoresist as an etch mask. The top surface of the lower substrate 200 is partially exposed by the openings 271, 272, and 273. The first silicon oxide layer 261*a* in which the openings 271, 272, and 273 are formed is used as a first etch mask M1 (described later).

Figure 6C:
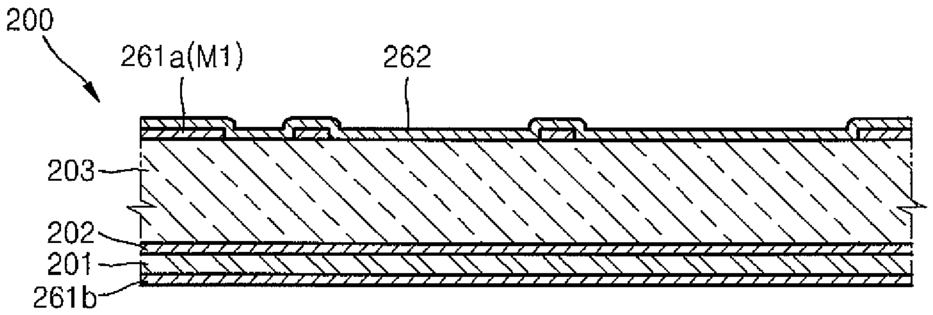

Referring to FIG. 6C, a second silicon oxide layer 262 is formed on the top surface of the lower substrate 200 exposed by the openings 271, 272, and 273, and on the first silicon oxide layer 261*a*. Here, the second silicon oxide layer 262 may be formed by plasma enhanced chemical vapor deposition (PECVD).

Figure 6D:
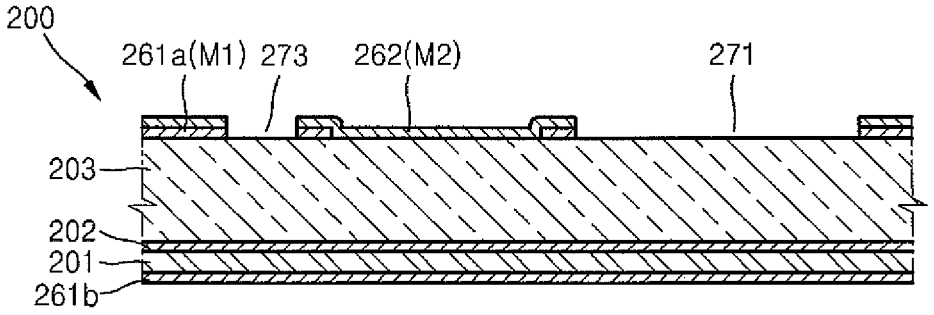

Referring to FIG. 6D, the second silicon oxide layer 262 is partially etched to open the first opening 271 for the manifold 220 and the third openings 273 for the dampers 240. The second silicon oxide layer 262 is used as a second etch mask M2 (described later).

Figure 6E:
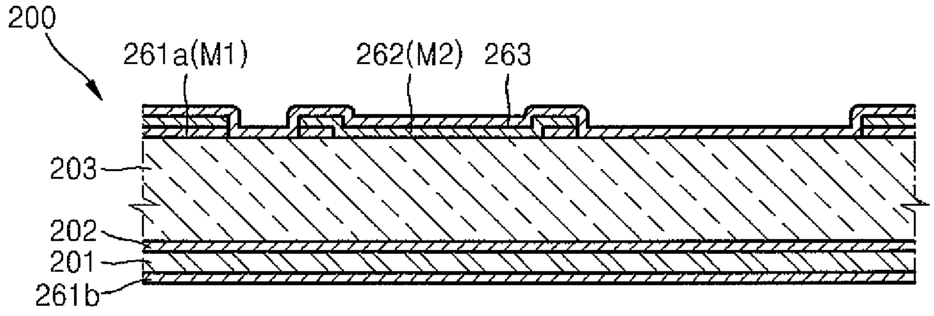

Referring to FIG. 6E, a third silicon oxide layer 263 is formed on the top surface of the lower substrate 200 exposed by the first and third openings 271 and 273, and on the second silicon oxide layer 262. Here, the second silicon oxide layer 262 may be formed by PECVD. Meanwhile, a parylene layer or a $Si_3N_4$ can be formed instead of the third silicon oxide layer 263.

Figure 6F:
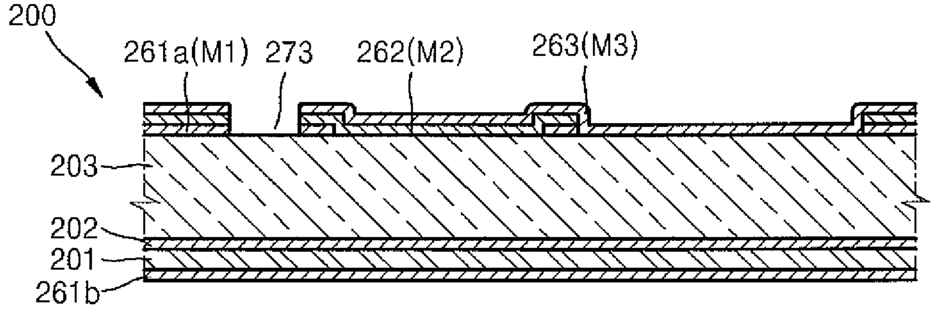

Referring to FIG. 6F, the third silicon oxide layer 263 is partially etched to open only the third openings 273 for the dampers 240. The third silicon oxide layer 263 (or the parylene layer or the $Si_3N_4$) is used as a third etch mask M3 (described below).

Figure 6G:
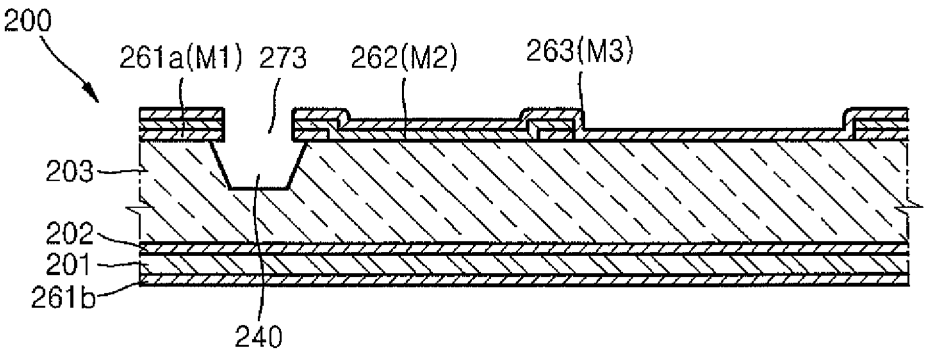

Referring to FIG. 6G, the second silicon layer 203 of the lower substrate 200 exposed by the third openings 273 is wet etched to a predetermined depth using the third etch mask M3 in order to partially form the dampers 240. The etching of the second silicon layer 203 of the lower substrate 200 may be performed by a wet etching method using silicon etchant, such as TMAH or KOH. Wet etching of the second silicon layer 203 described hereinafter may be performed using the same method. When the dampers 240 are formed by wet etching, sidewalls of the dampers 240 can be inclined such that the dampers 240 can have a reversed pyramid shape. Further, top ends of the dampers 240 are slightly wider than the third opening 273. Then, the third etch mask M3 is removed.

Figure 6H:
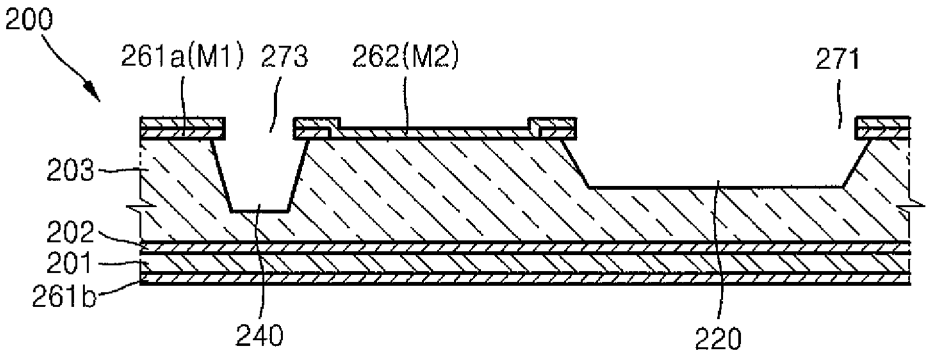

Referring to FIG. 6H, the second silicon layer 203 of the lower substrate 200 exposed by the first and third openings 271 and 273 is wet etched to predetermined depths using the second etch mask M2 to form a portion of the manifold 220 and to deepen the dampers 240. Sidewalls of the manifold 220 are inclined, and the top end of the manifold 220 is slightly wider than the first opening 271 formed in the second etch mask M2. Then, the second etch mask M2 is removed.

Figure 6I:
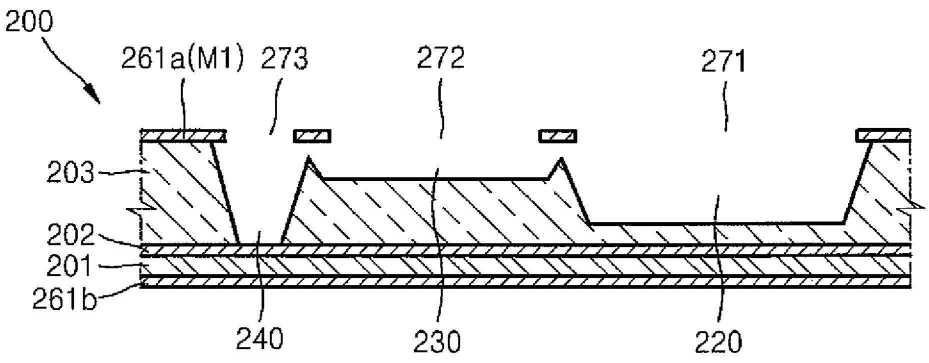

Referring to FIG. 6I, the second silicon layer 203 of the lower substrate 200 exposed by the openings 271, 272, and 273 is wet etched using the first etch mask M1 to form the pressure chambers 230 to a predetermined depth and to deepen the manifold 220 to a desired depth. Further, the dampers 240 are further deepened to the intervening oxide layer 202 (functioning as the etch stop layer), such that the dampers 240 can have a constant depth due to the intervening oxide layer 202. Since the manifold 220, the pressure chambers 230, and the dampers 240 have inclined side walls and top ends wider than the openings 271, 272, and 273 due to the anisotropic characteristic of the wet etching, the manifold 220, the pressure chambers 230, and the dampers 240 can be connected to each other as illustrated in FIG. 6K. Then, the first etch mask M1 is removed.

Figure 6J:
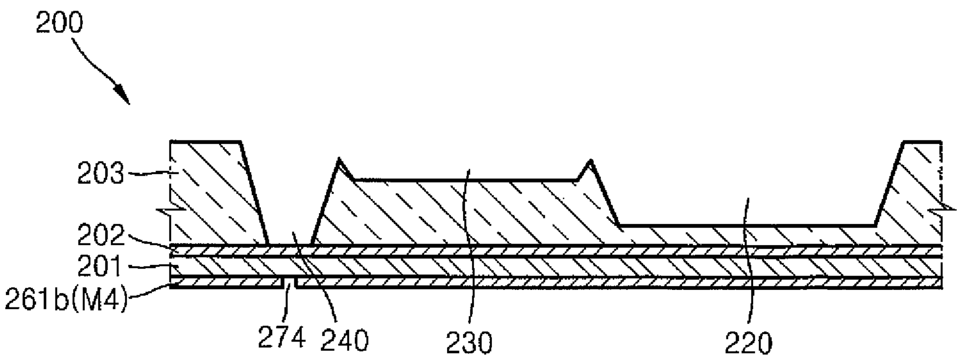
Figure 6K:
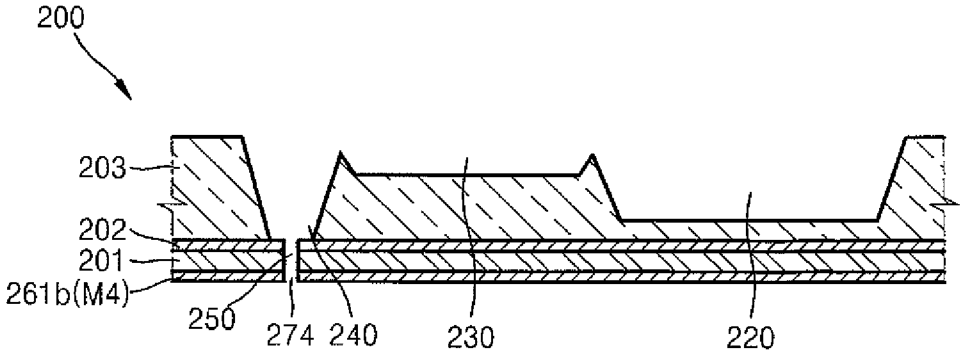

Referring to FIG. 6J, the first silicon layer 261*b* formed on the bottom surface of the lower substrate 200 is partially etched to form fourth openings 274 (one illustrated) for the nozzles 250 illustrated in FIG. 3A. By the fourth openings 274, the bottom surface of the lower substrate 200 is partially exposed. The first silicon oxide layer 261*b* having the fourth openings 274 is used as a fourth etch mask M4.

Referring to FIG. 6K, the first silicon layer 201 and the intervening oxide layer 202 of the lower substrate 200 exposed by the fourth openings 274 are sequentially etched using the fourth etch mask M4, in order to form the nozzles 250 through the first silicon layer 201 and the intervening oxide layer 202 to the dampers 240. The etching of the first silicon layer 201 and the intervening oxide layer 202 may be performed by dry etching, such as RIE using ICP. Then, the first silicon oxide layer 261*b*, that is, the fourth etch mask M4, is removed from the bottom surface of the lower substrate 200.

As described above, the lower substrate 200 is completely formed by the operations illustrated in FIGS. 6A through 6K, in which the manifold 220, the pressure chambers 230, and the dampers 240 are formed in the lower substrate 200 by wet etching, and the nozzles 250 are formed in the lower substrate 200 by dry etching.

Figure 7A:
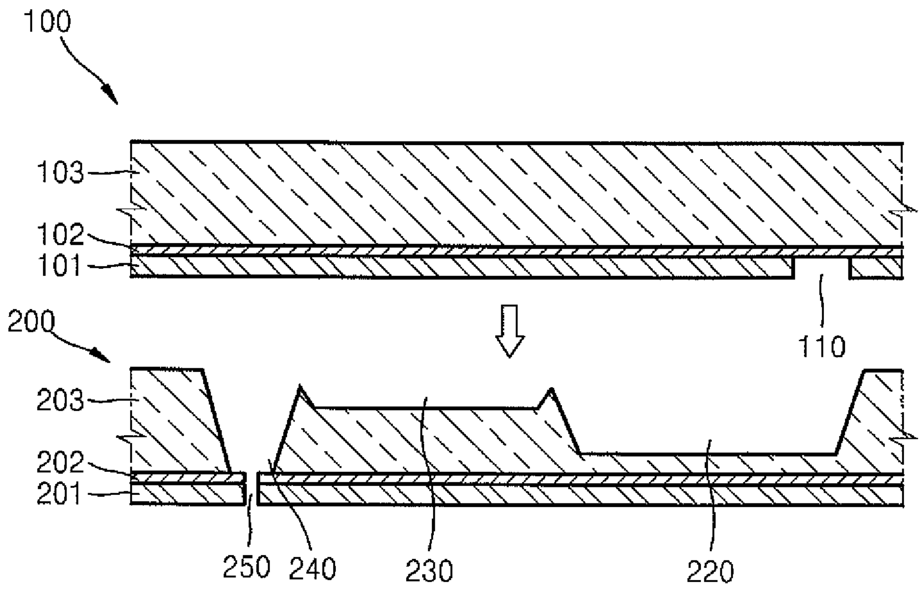
FIGS. 7A and 7B are views illustrating a stacking and bonding of the upper substrate and the lower substrate and an adjusting of a thickness of the upper substrate of the piezoelectric inkjet printhead illustrated in FIGS. 3A and 3B according to an embodiment of the present general inventive concept.
Figure 7B:
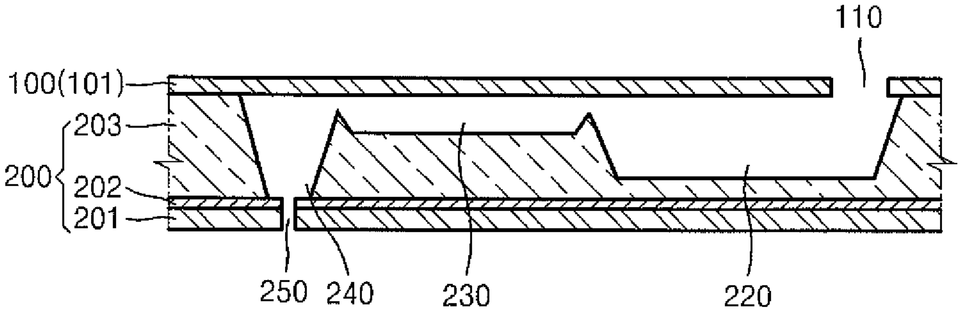

FIGS. 7A and 7B are views illustrating a stacking and bonding of the upper substrate 100 and the lower substrate 200 and an adjusting of the thickness of the upper substrate 100 illustrated in FIGS. 3A and 3B according to an embodiment of the present general inventive concept.

Referring to FIG. 7A, the upper substrate 100 is stacked and bonded on the lower substrate 200. The bonding of the two substrates 100 and 200 may be performed by, for example, a well-known silicon direct bonding (SDB) method.

Since only two substrates 100 and 200 are used for the inkjet printhead of the present embodiment as described above, the inkjet printhead can be formed through a single SDB process.

Next, the second silicon layer 103 and the intervening oxide layer 102 are removed from the upper substrate 100 bonded on the lower substrate 200. As a result, only the first silicon layer 101 remains in the upper substrate 100, and thus the ink inlet 110 formed in the first silicon layer 101 is opened. The removal of the second silicon layer 103 and the intervening oxide layer 102 may be performed by, for example, wet etching, dry etching, or chemical-mechanical polishing (CMP). Meanwhile, if the upper substrate 100 is formed of a single crystal silicon substrate, the thickness of the upper substrate 100 reduces to about 5 μm to about 13 μm after the wet etching, dry etching, or chemical-mechanical polishing (CMP).

The remaining first silicon layer 101 or the thinned upper substrate 100 may function as a vibrating plate deformable by the operation of a piezoelectric actuator 190 illustrated in FIG. 3A (described later).

Meanwhile, the ink inlet 110 can be formed in the upper substrate 100 after the upper substrate 100 is thinned.

Figure 8:
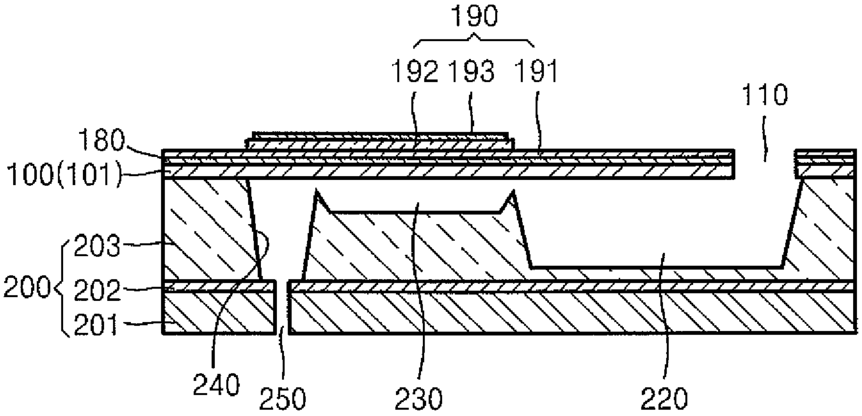
FIG. 8 is a view illustrating a forming of a piezoelectric actuator on the upper substrate of the piezoelectric inkjet printhead illustrated in FIGS. 3A and 3B according to an embodiment of the present general inventive concept.

FIG. 8 is a view illustrating a forming of a piezoelectric actuator on the upper substrate 100 of the piezoelectric inkjet printhead illustrated in FIGS. 3A and 3B according to an embodiment of the present general inventive concept.

Referring to FIG. 8, the piezoelectric actuator 190 is formed on the top surface of the upper substrate 100 that is stacked and bonded on the lower substrate 200. In detail, the lower electrode 191 of the piezoelectric actuator 190 is formed on the top surface of the upper substrate 100. The lower electrode 191 may be formed of two thin metal layers of, for example, titanium (Ti) and platinum (Pt). In this case, the lower electrode 191 may be formed by sputtering titanium (Ti) and platinum (Pt) on the entire surface of the upper substrate 100 to predetermined thicknesses, respectively. Meanwhile, the silicon oxide layer 180 may be formed between the upper substrate 100 and the lower electrode 191 as an insulating layer. In this case, the lower electrode 191 is formed on the entire surface of the silicon oxide layer 180.

Next, the piezoelectric layer 192 and the upper electrode 193 are formed on the lower electrode 191. Specifically, a piezoelectric material paste is applied to the upper substrate 100 (or the silicon oxide layer 180) above the pressure chamber 230 to a predetermined thickness by screen printing, and then dried for a predetermined period of time in order to form the piezoelectric layer 192. Various piezoelectric materials can be used for the piezoelectric layer 192, such as a PZT ceramic material. Next, an electrode material, such as Ag—Pd paste, is screen printed on the dried piezoelectric layer 192 to form the upper electrode 193. Next, the piezoelectric layer 192 and the upper electrode 193 are sintered at a predetermined temperature (e.g., 900 to 1,000° C.). After that, an electric field is applied to the piezoelectric layers 192 to activate a piezoelectric characteristic of the piezoelectric layers 192 (e.g., a polling treatment). In this way, the piezoelectric actuator 190 having the lower electrode 191, the piezoelectric layer 192, and the upper electrode 193 is formed on the upper substrate 100. Meanwhile, if the upper substrate 100 is thin, the piezoelectric layer 192 and the upper electrode 193 may be formed by a sol-gel method instead of the screen printing method.

In this way, the piezoelectric inkjet printhead illustrated in FIGS. 3A and 3B is manufactured.

A method of manufacturing the piezoelectric inkjet printhead of FIGS. 4A and 4B, according to an embodiment of the present general inventive concept, will now be described. In the method of manufacturing the piezoelectric inkjet printhead of FIGS. 4A and 4B according to the present embodiment, operations of forming the upper substrate 300, bonding of the upper substrate 300 and the lower substrate 400, and forming of the piezoelectric actuator 390 are the same as in the method of manufacturing the piezoelectric inkjet printhead of FIGS. 3A and 3B according to the previous embodiment illustrated in FIGS. 5A through 5D and 7A through 8. Thus, descriptions thereof will be omitted. Only the forming of the lower substrate 400 will now be briefly described, concentrating on differences from the method of manufacturing the piezoelectric inkjet printhead of FIGS. 3A and 3B according to the previous embodiment illustrated in FIGS. 6A through 6K.

FIGS. 9A through 9G are views illustrating a forming of the manifold 420, the plurality of pressure chambers 430, the plurality of dampers 440, and the plurality of nozzles 450 in the lower substrate 400 of the piezoelectric inkjet printhead illustrated in FIGS. 4A and 4B according to an embodiment of the present general inventive concept.

Figure 9A:
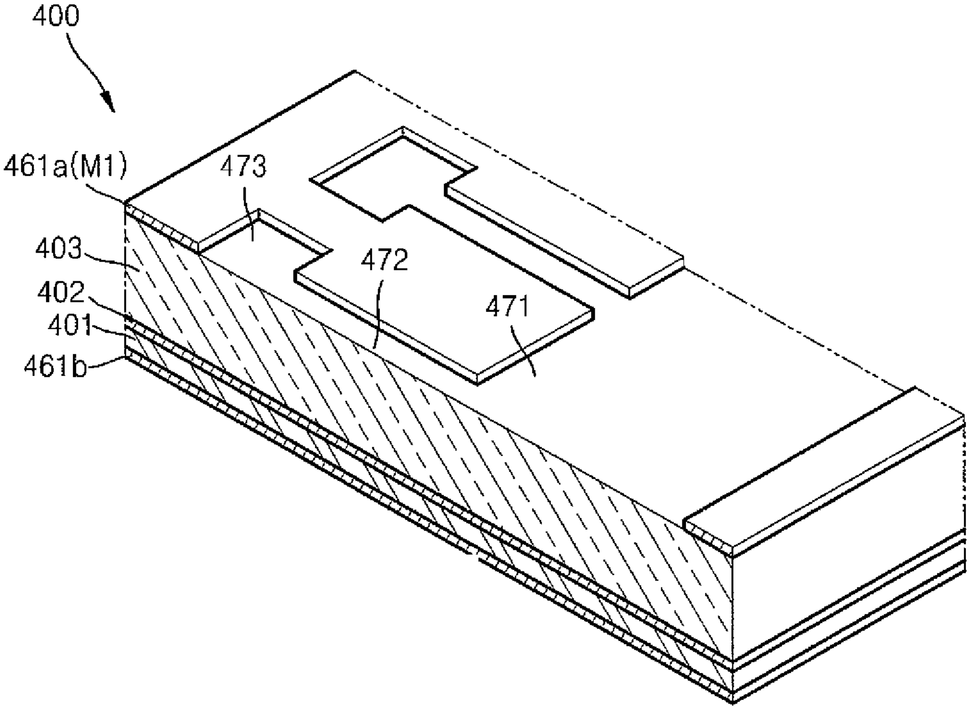
FIGS. 9A through 9G are views illustrating a forming of a manifold, a plurality of pressure chambers, a plurality of dampers, and a plurality of nozzles in a lower substrate of the piezoelectric inkjet printhead illustrated in FIGS. 4A and 4B according to an embodiment of the present general inventive concept.

Referring to FIG. 9A, the lower substrate 400 is formed using an SOI substrate including the first silicon layer 401 with a thickness of about 30 μm to about 100 μm, the intervening oxide layer 402 with a thickness of about 0.3 μm to about 2 μm, and the second silicon layer 403 with a thickness of about several hundreds μm (e.g., about 210 μm).

The lower substrate 400 is wet and/or dry oxidized to form first silicon oxide layers 461*a* and 461*b* on top and bottom surfaces to a thickness of about 5,000 Å to 15,000 Å. Next, the first silicon oxide layer 461*a* formed on the top surface of the lower substrate 400 is partially etched to form a first opening 471 for the manifold 420 illustrated in FIG. 4A, second openings 472 for the pressure chambers 430, and third openings 473 for the dampers 440. Here, first ends of the second openings 472 for the pressure chambers 430 are connected with the first opening 471 for the manifold 420, and second ends thereof are connected with the third openings 473 for the dampers 440. The first silicon oxide layer 461*a* in which the openings 471, 472, and 473 are formed is used as a first etch mask M1 (described later).

Figure 9B:
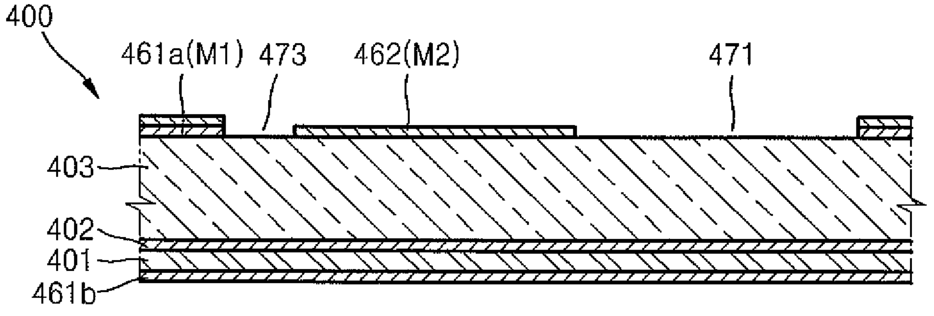

Referring to FIG. 9B, PECVD is used to form a second silicon oxide layer 462 on the top surface of the lower substrate 400 exposed by the openings 471, 472, and 473, and on the first silicon oxide layer 461*a*. Next, the second silicon oxide layer 462 is partially etched to open the first opening 471 for the manifold 420 and the third openings 473 for the dampers 440. The second silicon oxide layer 462 is used as a second etch mask M2 (described later).

Figure 9C:
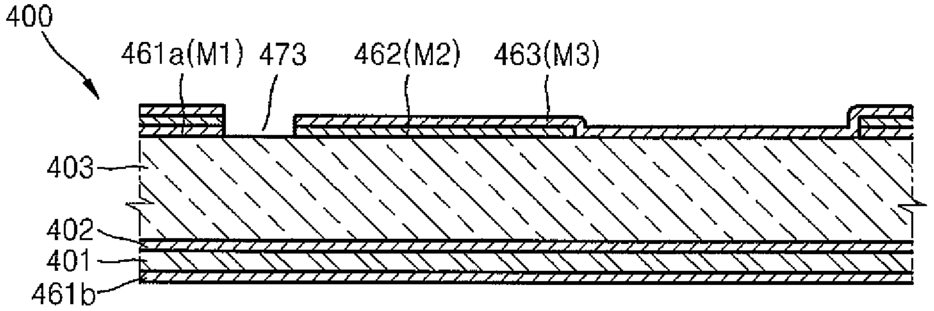

Referring to FIG. 9C, PECVD is used to form a third silicon oxide layer 463 on the top surface of the lower substrate 400 exposed by the first and third openings 471 and 473, and on the second silicon oxide layer 462. Next, the third silicon oxide layer 463 is partially etched to open only the third openings 473 for the dampers 440. The third silicon oxide layer 463 is used as a third etch mask M3 (described later). Meanwhile, a $Si_3N_4$ layer and a photoresist layer may be used as the third etch mask M3 instead of the third silicon oxide layer 463.

Figure 9D:
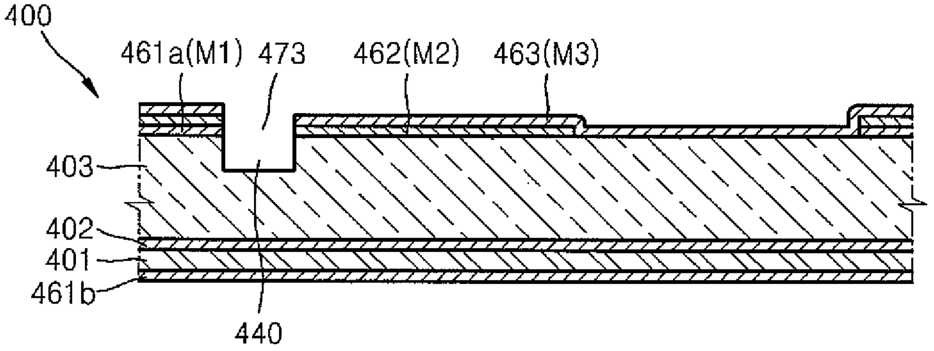

Referring to FIG. 9D, the second silicon layer 403 of the lower substrate 400 exposed by the third openings 473 is dry etched to a predetermined depth using the third etch mask M3 in order to partially form the dampers 440. The etching of the second silicon layer 403 of the lower substrate 400 may be performed by a dry etching method, such as RIE using ICP. Dry etching of the second silicon layer 403 described hereinafter may be performed using the same method. In the case where the dampers 440 are formed by dry etching, sidewalls of the dampers 440 are vertically formed, unlike the case where the dampers 440 are formed by wet etching. For example, if the third openings 473 have a circular shape, the dampers 440 have a circular section. Then, the third etch mask M3 is removed.

Figure 9E:
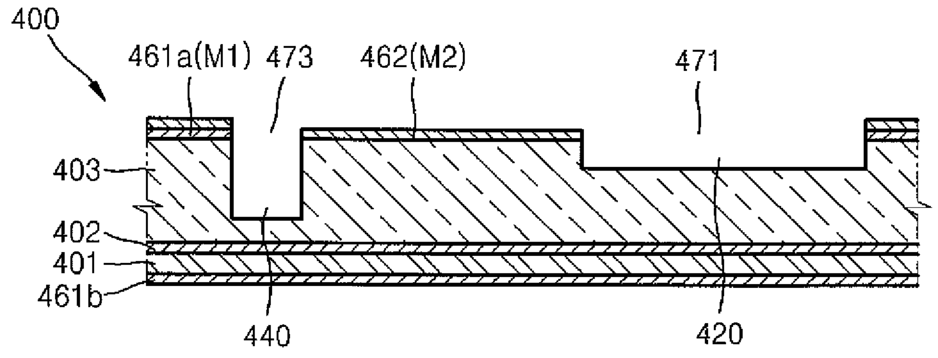

Referring to FIG. 9E, the second silicon layer 403 of the lower substrate 400 exposed by the first and third openings 471 and 473 is dry etched to predetermined depths using the second etch mask M2 to form a portion of the manifold 420 and to deepen the dampers 440. Then, the second etch mask M2 is removed.

Figure 9F:
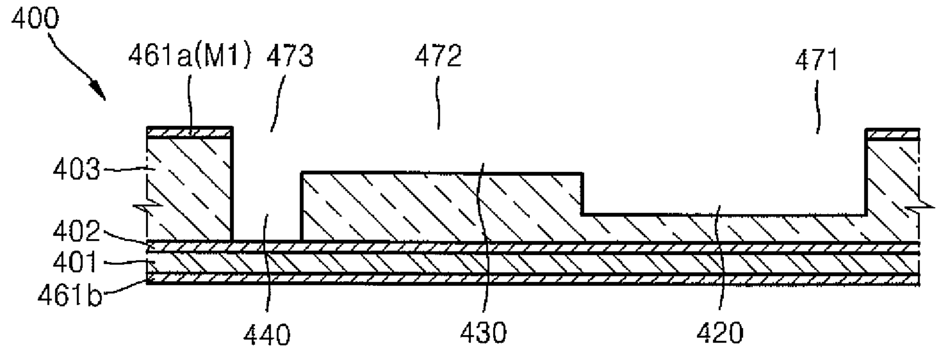

Referring to FIG. 9F, the second silicon layer 403 of the lower substrate 400 exposed by the openings 471, 472, and 473 is dry etched using the first etch mask M1 to form the pressure chambers 430 to a predetermined depth and to deepen the manifold 420 to a desired depth. Further, the dampers 440 are further deepened to the intervening oxide layer 402 (functioning as the etch stop layer), such that the dampers 440 can have a constant depth due to the intervening oxide layer 402. Then, the first etch mask M1 is removed.

Figure 9G:
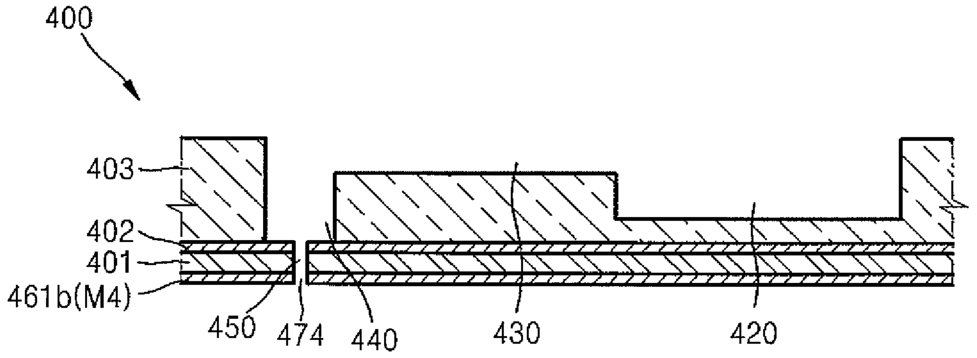

Referring to FIG. 9G, the first silicon layer 461*b* formed on the bottom surface of the lower substrate 400 is partially etched to form fourth openings 474 (one illustrated) for the nozzles 450 illustrated in FIG. 4A and FIG. 9G. The first silicon oxide layer 461*b* having the fourth openings 474 is used as a fourth etch mask M4. Next, the first silicon layer 401 and the intervening oxide layer 402 of the lower substrate 400 exposed by the fourth openings 474 are sequentially etched using the fourth etch mask M4, in order to form the nozzles 450 through the first silicon layer 401 and the intervening oxide layer 402 to the dampers 440. Then, the first silicon oxide layer 461*b*, that is, the fourth etch mask M4, is removed from the bottom surface of the lower substrate 400.

In this way, the lower substrate 400 is formed by the operations illustrated in FIGS. 9A through 9G, in which the manifold 420, the pressure chambers 430, the dampers 440, and the nozzles 450 are formed in the lower substrate 400 by dry etching.

As described above, according to various embodiments of the present general inventive concept, a piezoelectric inkjet printhead and a method of manufacturing the same provide several advantages. For example, since the piezoelectric inkjet printhead according to embodiments of the present general inventive concept is configured with two silicon substrates, the piezoelectric inkjet printhead can be simply manufactured using one SDB process, so that a manufacturing yield of the piezoelectric inkjet printhead can be increased, thereby decreasing a manufacturing cost. In addition, since a lower substrate is formed of an SOI substrate, an intervening oxide layer of the SOI substrate can be used as an etch stop layer such that a plurality of nozzles can be formed uniformly. Therefore, the nozzles can eject ink droplets with a uniform speed and volume. That is, an ink ejecting performance of the nozzles can be improved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a piezoelectric inkjet printhead, comprising:

processing a lower silicon-on-insulator substrate having a sequentially stacked structure, the sequentially stacked structure with a first silicon layer, an intervening oxide layer, and a second silicon layer, processing the lower silicon-on-insulator substrate, by etching the second silicon layer to form a manifold, a plurality of pressure chambers arranged along at least one side of the manifold and connected with the manifold, and a plurality of dampers connected with the pressure chambers, and by etching the first silicon layer and the intervening oxide layer to form a plurality of vertical nozzles through the first silicon layer and the intervening oxide layer to corresponding ones of the plurality of dampers;

stacking and bonding an upper substrate on the lower substrate;

reducing the upper substrate to a predetermined thickness; and forming a piezoelectric actuator on the upper substrate, the piezoelectric actuator functions during operation to apply a driving force to the respective pressure chambers to eject ink, wherein the dampers are formed to have a depth substantially equal to a thickness of the second silicon layer by etching the second silicon layer using the intervening oxide layer as an etch stop layer, and the nozzles are formed to have a length substantially equal to a total thickness of the first silicon layer and the intervening oxide layer or substantially equal to a thickness of the first silicon layer.

2. The method of claim 1, wherein the manifold has a depth smaller than the thickness of the second silicon layer, and the pressure chambers have a depth smaller than the depth of the manifold.

3. The method of claim 1, wherein the processing of the lower substrate comprises:

forming a first etch mask on a top surface of the second silicon layer, the first etch mask including a first opening corresponding to the manifold, second openings corresponding to the pressure chambers, and third openings corresponding to the dampers;

forming a second etch mask on the top surface of the second silicon layer and a top surface of the first etch mask, the second etch mask covering the second openings and opening the first and third openings;

forming a third etch mask on the top surface of the second silicon layer and a top surface of the second etch mask, the third etch mask covering the first and second openings and opening the third openings; and forming the manifold, the pressure chambers, and the dampers by etching the second silicon layer of the lower substrate sequentially using the third etch mask, the second etch mask, and the first etch mask.

4. The method of claim 3, wherein the manifold, the pressure chambers, and the dampers comprise sidewalls inclined with respect to an ink ejecting direction by wet etching the second silicon layer of the lower substrate.

5. The method of claim 4, wherein first and second ends of each of the plurality of pressure chambers taper toward the manifold and corresponding ones of the plurality of dampers, respectively, and are connected to the manifold and the corresponding ones of the plurality of dampers, respectively.

6. The method of claim 4, wherein the first opening, the second openings, and the third openings are spaced from each other by a predetermined distance.

7. The method of claim 4, wherein the first and second etch masks are formed of silicon oxide layers, and the third etch mask is formed of at least one layer selected from the group consisting of a silicon oxide layer, a parylene layer, and a $Si_3N_4$ layer.

8. The method of claim 4, wherein the wet etching of the second silicon layer of the lower substrate is performed using tetramethyl ammonium hydroxide or KOH as a silicon etchant.

9. The method of claim 3, wherein the manifold, the pressure chambers, and the dampers comprise sidewalls vertically formed with respect to an ink ejecting direction by dry etching the second silicon layer of the lower substrate.

10. The method of claim 9, wherein first and second ends of the second openings are connected to the first opening and the third openings, respectively.

11. The method of claim 9, wherein the first and second etch masks are formed of silicon oxide layers, and the third etch mask is formed of at least one layer selected from the group consisting of a silicon oxide layer, a photoresist layer, and a $Si_3N_4$ layer.

12. The method of claim 9, wherein the dry etching of the second silicon layer of the lower substrate comprises:

performing reactive ion etching using inductively coupled plasma.

13. The method of claim 1, wherein the nozzles are formed into a vertical hole shape having a constant diameter by dry etching the first silicon layer and the intervening oxide layer of the lower substrate.

14. The method of claim 13, wherein the dry etching of the first silicon layer and the intervening oxide layer of the lower substrate comprises:

performing reactive ion etching using inductively coupled plasma.

15. The method of claim 1, wherein the upper substrate is formed of a single crystal silicon substrate or an SOI substrate.

16. The method of claim 1, further comprising:

forming an ink inlet in the upper substrate, the ink inlet being connected with the manifold.

17. The method of claim 16, wherein the forming of the ink inlet is performed prior to the stacking and bonding of the upper substrate or after the reducing of the upper substrate.

18. The method of claim 16, wherein the forming of the ink inlet comprises:

performing dry or wet etching.

19. The method of claim 1, wherein the bonding of the upper substrate on the lower substrate comprises:

performing silicon direct bonding to bond the upper substrate and the lower substrate.

20. The method of claim 1, wherein the reducing of the upper substrate is performed by dry or wet etching.

21. The method of claim 1, wherein the reducing of the upper substrate comprises:

performing chemical-mechanical polishing.

22. The method of claim 1, wherein the forming of the piezoelectric actuator comprises:

forming a lower electrode on the upper substrate;

forming a plurality of piezoelectric layers on the lower electrode, the piezoelectric layers corresponding to the pressure chambers;

forming an upper electrode on each of the piezoelectric layers; and performing polling on the respective piezoelectric layers by applying an electric field to the piezoelectric layers to activate a piezoelectric characteristic of the piezoelectric layers.

* * * * *